United States Patent
Mutou

(10) Patent No.: US 7,172,934 B2
(45) Date of Patent: Feb. 6, 2007

(54) METHOD OF MANUFACTURING A SEMICONDUCTOR DEVICE WITH A SILICON-GERMANIUM GATE ELECTRODE

(75) Inventor: Akiyoshi Mutou, Ibaraki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/353,990

(22) Filed: Feb. 15, 2006

(65) Prior Publication Data

US 2006/0131559 A1    Jun. 22, 2006

Related U.S. Application Data

(62) Division of application No. 10/840,258, filed on May 7, 2004, now abandoned.

(30) Foreign Application Priority Data

May 8, 2003    (JP) ............... 2003-129986

(51) Int. Cl.
*H01L 21/8238* (2006.01)
(52) U.S. Cl. ...................... 438/197; 438/199
(58) Field of Classification Search ............. 438/197, 438/199, 301, 933
See application file for complete search history.

(56) References Cited

U.S. PATENT DOCUMENTS

| | | | |
|---|---|---|---|
| 4,603,471 A | 8/1986 | Strain | |
| 5,998,289 A | 12/1999 | Sagnes | |
| 6,132,806 A | 10/2000 | Dutartre | |
| 6,255,149 B1 | 7/2001 | Bensahel et al. | |
| 6,373,112 B1 | 4/2002 | Murthy et al. | |
| 6,744,104 B1 | 6/2004 | Aoki et al. | |
| 6,855,641 B2 * | 2/2005 | Ryu et al. ............... | 438/767 |
| 6,927,454 B2 | 8/2005 | Chan et al. | |
| 2001/0053601 A1 | 12/2001 | Mogami | |
| 2002/0098671 A1 | 7/2002 | Cheong | |
| 2003/0049919 A1 | 3/2003 | Yamamoto | |
| 2003/0183901 A1 | 10/2003 | Kanda et al. | |
| 2004/0067631 A1 | 4/2004 | Bu et al. | |
| 2004/0070421 A1 | 4/2004 | Kapoor | |

FOREIGN PATENT DOCUMENTS

| | | |
|---|---|---|
| JP | 11-031820 | 2/1999 |
| JP | 11-087708 | 3/1999 |
| JP | 2000-150669 | 5/2000 |
| JP | 2001-320045 | 11/2001 |
| JP | 2002-043566 | 2/2002 |
| JP | 2002-261047 | 9/2002 |
| JP | 2002-261274 | 9/2002 |
| JP | 2003-31806 | 1/2003 |
| JP | 2003-086798 | 3/2003 |
| WO | WO 9943024 | 8/1999 |

* cited by examiner

*Primary Examiner*—Hoai Pham
(74) *Attorney, Agent, or Firm*—Leydig, Voit & Mayer, Ltd.

(57) ABSTRACT

A $SiO_2$ film serving as a gate dielectric film is formed on a silicon substrate. A seed Si film is formed on the gate dielectric film. A thin SiGe film of a thickness of 50 nm or less is formed on the seed Si film at a temperature between 450° C. and 494° C., and a thin cap Si film of a thickness of 0.5 nm to 5 nm is continuously formed on the thin SiGe film at the same temperature.

6 Claims, 14 Drawing Sheets

METHOD OF MANUFACTURING A SEMICONDUCTOR DEVICE WITH A SILICON-GERMANIUM GATE ELECTRODE

This is a divisional of application Ser. No. 10/840,258 filed on May 7, 2004, now abandon.

FIELD OF THE INVENTION

The present invention relates to a semiconductor device and to a method for manufacturing thereof. More specifically the present invention relates to a gate electrode including a thin SiGe film and to a method for manufacturing thereof.

DESCRIPTION OF THE BACKGROUND ART

In recent years, MOSFET. (metal oxide semiconductor field effect transistor) as a semiconductor device has been extremely miniaturized and highly integrated. Concurrent-to this trend, the thickness of a gate dielectric film has been reduced from the point of view of securing the driving current and saving power consumption. However, the value of parasitic capacitance resulted from the depletion generated in a gate electrode composed of polysilicon due to the reduction of the thickness of gate dielectric films has not been able to ignored, thereby arising problems in the highly integration and power saving of MOSFETs.

In order to cope with such problems, the use of silicon germanium (hereafter abbreviated to "SiGe") for a gate electrode has been proposed. The use of a SiGe film in, the gate electrode of an MOSFET can improve the activation rate of conductive impurities (e.g., boron) in the gate electrode, inhibit the depletion of the gate electrode, thus reducing the parastic capacitance. This allows the use of a gate dielectric film with an increased thickness and the reduction of gate leakage current.

Although the width of the gate electrode (hereafter referred to as "gate length") must be reduced with the above-described miniaturization of the MOSFET, the thickness of the gate electrode must also be reduced from the point of view of the stability and the processing accuracy of gate wiring patterns. For example, according to the ITRS Roadmap of 2001 Edition, the thickness of agate electrode must be reduced to 35 nm to 70 nm in a semiconductor device of the 35-nm-gate-length generation.

In order to lower the resistance of a gate electrode, a silicide film may be formed above the SiGe film. In this case, there is a problem of the occurrence of silicide cohesion and defective resistance caused by Ge in the SiGe film during the formation of the cobalt silicide film. In order to solve this problem, there has been proposed to form a thick cap Si film on the SiGe film, and to adjust the Ge concentration in the surface of the cap Si film to 2% of less (e.g., refer to Japanese Patent Laid-Open No. 2002-261274 (Page 5, FIG. 1)).

In next-generation semiconductor devices, as described above, the thickness reduction of the SiGe film as the gate electrode is demanded. Furthermore, when a cap Si film is formed on the SiGe film to form a silicide film, since the thickness of the SiGe film must be the value of the entire thickness of the gate electrode minus the thickness of the silicon film, the SiGe film must further be thinned.

However, the own examinations by the present inventor revealed the occurrence of problems described below when the SiGe film is thinned.

FIGS. 13A to 13C are SEM photographs showing the cross section of the thinned SiGe film grown on a gate dielectric film composed of a $SiO_2$ film. Specifically, FIG. 13A shows the case where the SiGe film of a thickness of 150 nm is formed, FIG. 13B shows the case where the SiGe film of a thickness of 50 nm is formed, and FIG. 13C shows the case where the SiGe film of a thickness of 20 nm is formed.

As FIG. 13A shows, when the SiGe film is relatively thick (150 nm), the continuous film free of voids is attained. However, as FIG. 13B shows, when the growth time is shortened to make the thickness of the SiGe film 50 nm, voids (refer to circled portions in FIG. 13B) generate in the SiGe film. When the growth time is further shortened to make the thickness of the SiGe film 20 nm, the film becomes discontinuous due to surface roughness as FIG. 13C shows.

When the SiGe film is thinned, as described above, there are problems that voids generate in the SiGe film during growing the grains of the SiGe film, or the SiGe film becomes discontinuous due to surface roughness of the SiGe film, that is, a defective SiGe film is produced. There are also problems that the conformation of the SiGe film varies due to heat treatment performed after the formation of the SiGe film, thus forming of a defective SiGe film.

If the above-described defective film is formed due to the thinning of the SiGe film, it is difficult to form the SiGe film having a uniform Ge content in the boundary between the gate dielectric film and the gate electrode. In addition, when a gate electrode is formed using dry etching, locally defective processing caused by the non-uniformity of the thickness of the SiGe film. Since the voids generated in the SiGe film causes variation in the wiring resistance of the gate wirings and the driving ability of the transistor, the yield of transistor manufacturing is affected.

SUMMARY OF THE INVENTION

The present invention has been conceived to solve the previously-mentioned problems and a general object of the present invention is to provide novel and useful method for manufacturing a semiconductor device.

A more specific object of the present invention is to form a high-quality thin-SiGe film free of voids on a gate dielectric film.

The above object of the present invention is attained by a following semiconductor device and a following method for manufacturing a semiconductor device.

According to first aspect of the present invention, the semiconductor device comprises a gate dielectric film formed on a substrate and a gate electrode formed on the gate dielectric film. The gate electrode includes a seed Si film formed on the gate dielectric film; a thin SiGe film formed on the seed Si film and having a thickness of 50 nm or less; and a thin cap Si film formed on the thin SiGe film and having a thickness of 0.5 nm to 5 nm.

According to second aspect of the present invention, in the method, a gate dielectric film is first formed on a substrate. A seed Si film is formed on the gate dielectric film. A thin SiGe film on the seed Si film at a temperature between 450° C. and 494° C., and a thin cap Si film is continuously formed with a thickness of 0.5 nm to 5 nm on the thin SiGe film at the same temperature. The thin cap Si film, the thin SiGe film, and the seed Si film is patterned to form a gate electrode. Source-drain regions are formed in an upper layer of the substrate through ion implantation using the gate electrode as a mask.

According to third aspect of the present invention, in the method, a gate dielectric film is first formed on a substrate. A seed Si film is formed on the gate dielectric film. A thin SiGe film is formed on the seed Si film at a temperature between 450° C. and 494° C., and a thin cap Si film is continuously formed with a thickness of 0.5 nm to 5 nm on the thin SiGe film at the same temperature. An upper Si film is formed on the thin cap Si film at a temperature higher than a temperature of forming the thin SiGe film. The upper Si film, the thin cap Si film, the thin SiGe film, and the seed Si film are patterned to form a gate electrode. Source-drain regions are formed in an upper layer of the substrate through ion implantation using the gate electrode as a mask.

Other objects and further features of the present invention will be apparent from the following detailed description when read in conjunction with the accompanying drawings.

DETAILED DESCRIPTION OF THE PREFERRED EMBODIMENTS

Figure 1:
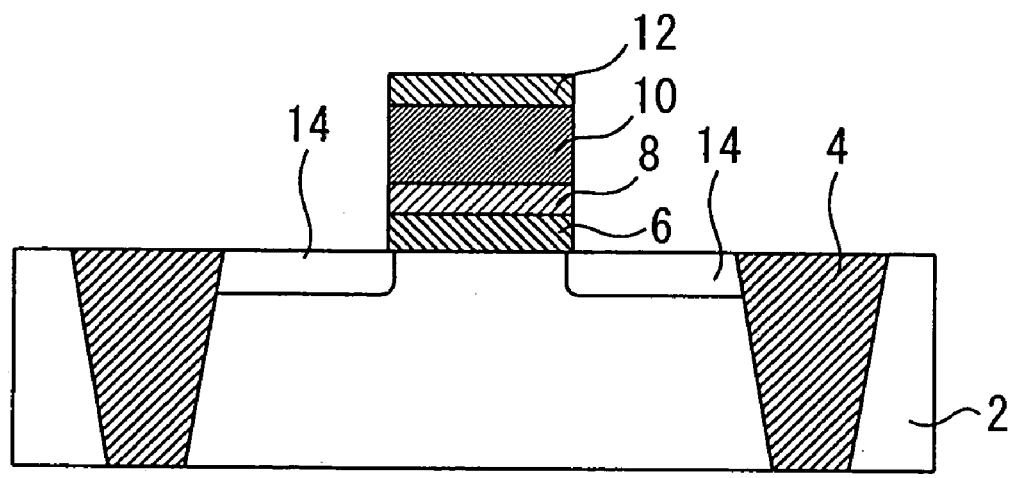
FIG. 1 is a schematic cross-sectional view for illustrating a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

First, the structure of a semiconductor device according to a first embodiment of the present invention will be described.

FIG. 1 is a schematic cross-sectional view for illustrating a semiconductor device according to a first embodiment of the present invention.

As FIG. 1 shows, a silicon substrate serving as the substrate 2 has element regions on which semiconductor elements such as transistors are formed, and isolation regions for isolating the element regions, in which field insulating films (also referred to as "element-isolating insulating films") 4 are formed. Well regions (not shown) are formed in the element regions of the substrate 2.

On the substrate 2 in the element regions, a gate dielectric film 6 is formed. As the gate dielectric film 6, for example, a $SiO_2$ film, a $Si_3N_4$ film, or a SiON film (hereafter collectively referred to as "$SiO_2$ film or the like") can be used. The thickness of the gate dielectric film 6 composed of a $SiO_2$ film or the like is, for example, 1.0 nm to 1.5 nm. In place of the $SiO_2$ film or the like, a high-dielectric-constant film (high-k dielectric film) can be used as the gate dielectric film 6. A laminated film composed of a $SiO_2$ film or the like and a high-dielectric-constant film can also be used as the gate dielectric film 6. In this case, the thickness of the $SiO_2$ film or the like is less than 1.0 nm. Here, as the high-dielectric-constant film, for example, a metal oxide such as $Al_2O_3$, $HfO_2$, $ZrO_2$, and $La_2O_3$, a metal nitride, a metal oxynitride, a metal silicate such as $HfSiO_x$ and $ZrSiO_x$, or a metal aluminate such as $HfAlO_x$ and $ZrAlO_x$, can be used.

On the gate dielectric film 6 is formed a gate electrode composed of the laminate of a seed Si film 8, a thin SiGe film 10, and a thin cap Si film 12. Source-drain regions 14 sandwiching a channel region (not shown) underneath the gate electrode are formed in the upper layer of the silicon substrate 2.

Next, the gate electrode will be described.

On the gate dielectric film 6 is formed an amorphous Si film serving as the seed Si film 8. The thickness of the seed Si film 8 is preferably 1 nm to 5 nm.

On the seed Si film 8 is formed a thin SiGe film 10 as a lower electrode film. The thickness of the thin SiGe film 10 is preferably 50 nm or below. The thin SiGe film 10 is represented by a composition formula of $Si_{(1-x)}Ge_x$, and the Ge content X is preferably 0.15 or more and smaller than 0.4 (15% or more and smaller than 40%), and more preferably about 0.3 (30%) (described later). The thin SiGe film 10 is preferably grown at a growth temperature of 450° C. or above and below 494° C. (described later). The thin SiGe film 10 is also preferably a polycrystalline thin SiGe film grown under a growth pressure of 30 Pa or amorphous SiGe grown under a growth pressure 150 Pa or above (described later).

On the thin SiGe film 10 is formed a thin cap Si film 12. The thickness of the thin cap Si film 12 is preferably 0.5 nm to 5 nm (described later). It is preferable that the thin SiGe film 10 and the thin cap Si film 12 are continuously formed using the same apparatus at the same temperature.

Next, a method for manufacturing the above-described semiconductor device will be described.

FIGS. 2A to 2D are process sectional views for illustrating a method for manufacturing the semiconductor device shown in FIG. 1.

Figure 2A:
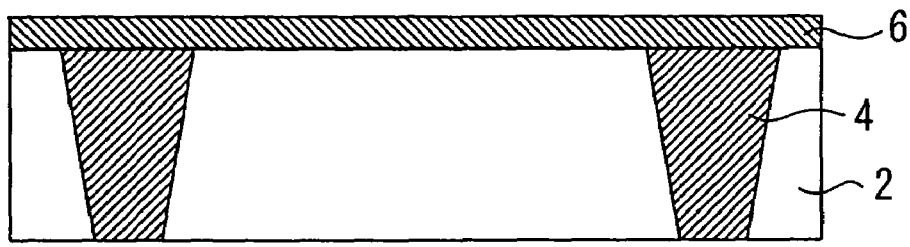
FIGS. 2A to 2D are process sectional views for illustrating a method for manufacturing the semiconductor device shown in FIG. 1.

First, as FIG. 2A shows, field insulating films 4 are formed in the isolation regions of a silicon substrate 2 using STI (shallow trench isolation) method. Then, the ions of a conductive impurity are implanted into the element regions (not shown) of the silicon substrate 2, and annealing is performed to form well regions.

Next, after a predetermined pretreatment (e.g., the removal of natural oxide films) has been performed, a $SiO_2$ film or the like (described above) with a thickness of, for example, 1.0 nm to 1.5 nm is formed as a gate dielectric film 6 on the silicon substrate 2 using a method such as thermal oxidation (or thermal nitriding or thermal oxynitriding) or plasma oxidation (or plasma nitriding or plasma oxynitriding).

As described above, a high-k dielectric film can be formed as the gate dielectric film 6 in place of the $SiO_2$ film or the like, or together with the $SiO_2$ film or the like. When a laminated structure composed of a $SiO_2$ film or the like and a high-k dielectric film is used, the thickness of the $SiO_2$ film or the like is less than 1.0 nm. The high-k dielectric film can be grown using an ALD (atomic layer deposition) method or an MOCVD (metal organic chemical vapor deposition) method.

Next, as FIG. 2A shows, an amorphous Si film as a seed Si film 8 with a thickness of, for example, 1 nm to 5 nm is formed on the gate dielectric film 6 using a CVD (chemical vapor deposition) method. For the formation of the seed Si film 8, for example, a batch-type vertical LPCVD apparatus can be used. The conditions for forming the seed Si film 8 in the LPCVD apparatus are, for example, an $SiH_4$ flow rate of 1 slm, a growth temperature of 475° C., and a growth time of 5 to 20 minutes.

Figure 2B:
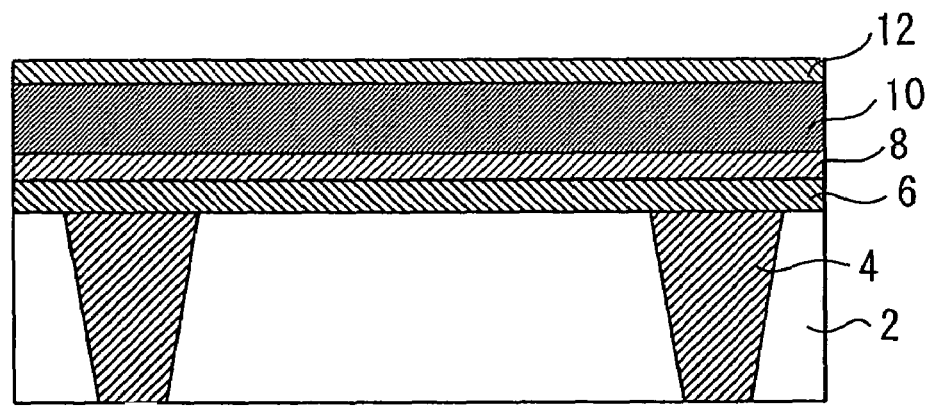

Then, as FIG. 2B shows, a thin SiGe film 10 is formed on the seed Si film 8 using the above-described LPCVD apparatus. Specifically, the seed Si film 8 and the thin SiGe film 10 are continuously formed.

Here, the Ge content X in the thin SiGe film 10 represented by the composition formula, $Si_{(1-x)}Ge_x$, is preferably 0.15 or more and smaller than 0.4 (15% or more and smaller than 40%), and most preferably 0.3 (30%). The own examinations by the present inventor on the Ge content will be described below. The present inventor examined the relationship between the Ge content in a thin SiGe film formed on a gate dielectric film through a seed Si film and the depletion rate in an MOS capacitor.

Figure 3A:
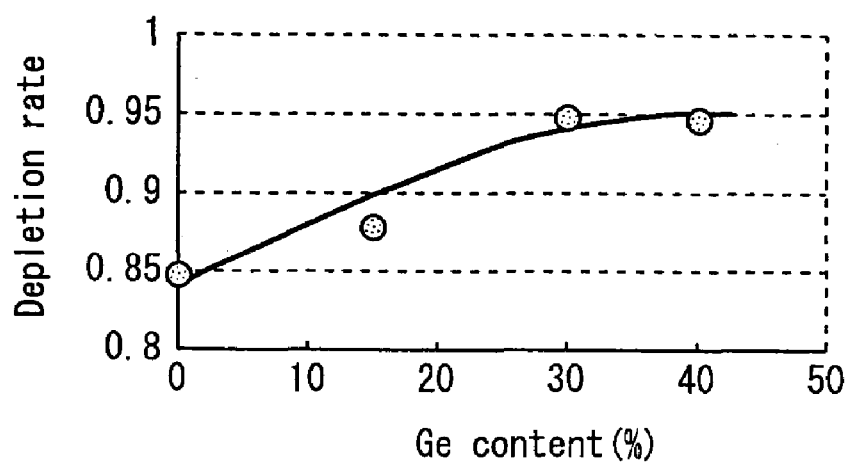
FIGS. 3A and 3B are graphs showing the relationship between the Ge content in a thin SiGe film and the depletion rate in an MOS capacitor.
Figure 3B:
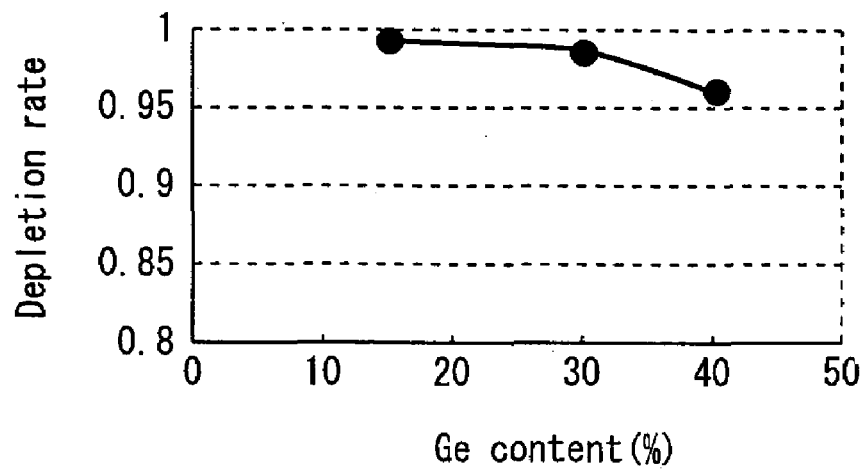

FIGS. 3A and 3B are graphs showing the relationship between the Ge content in a thin SiGe film and the depletion rate in an MOS capacitor. In other words, FIGS. 3A and 3B are graphs showing the Ge-content dependency of the depletion rate in an MOS capacitor. Specifically, FIG. 3A is a graph showing the Ge-content dependency of the depletion rate in a PMOS capacitor; and FIG. 3B is a graph showing the Ge-content dependency of the depletion rate in an NMOS capacitor. Here, the depletion rate means the percentage of the inverted capacitance to the accumulated capacitance in an MOS capacitor.

As FIG. 3A shows, the depletion rate on a PMOS capacitor is improved with increase in the Ge content, and although the improving effect is not satisfactory when the Ge content is less than 0.15 (15%), the improving effect is saturated when the Ge content is 0.3 (30%) or more. This shows that increase in the Ge content to 0.15 (15%) or more improves the depletion rate of the PMOS capacitor, and improve the driving ability of the PMOS transistor. On the other hand, as FIG. 3B shows, although the depletion rate of an NMOS capacitor little changes when the Ge content is 0.3 (30%) or less, the depletion rate is lowered when the Ge content is 0.4 (40%), and the driving ability of the NMOS transistor is lowered.

Therefore, in order to make the improvement of gate depletion and driving ability of a PMOS transistor compatible to the avoidance of lowered driving ability of an NMOS transistor, the Ge content in the thin SiGe film 10 is preferably 0.15 or more and smaller than 0.4 (15% or more and smaller than 40%), and most preferably 0.3 (30%) as described above.

The growth temperature of the thin SiGe film 10 is preferably 450° C. or above and 494° C. or below, and most preferably 475° C. The own examinations by the present inventor on the growth temperature will be described below. The present inventor examined the relationship between the growth temperature of a thin SiGe film formed on a gate dielectric film composed of a $SiO_2$ film through a seed Si film, and the growth rate and the uniformity of the film thickness on the surface of the thin SiGe film.

Figure 4:
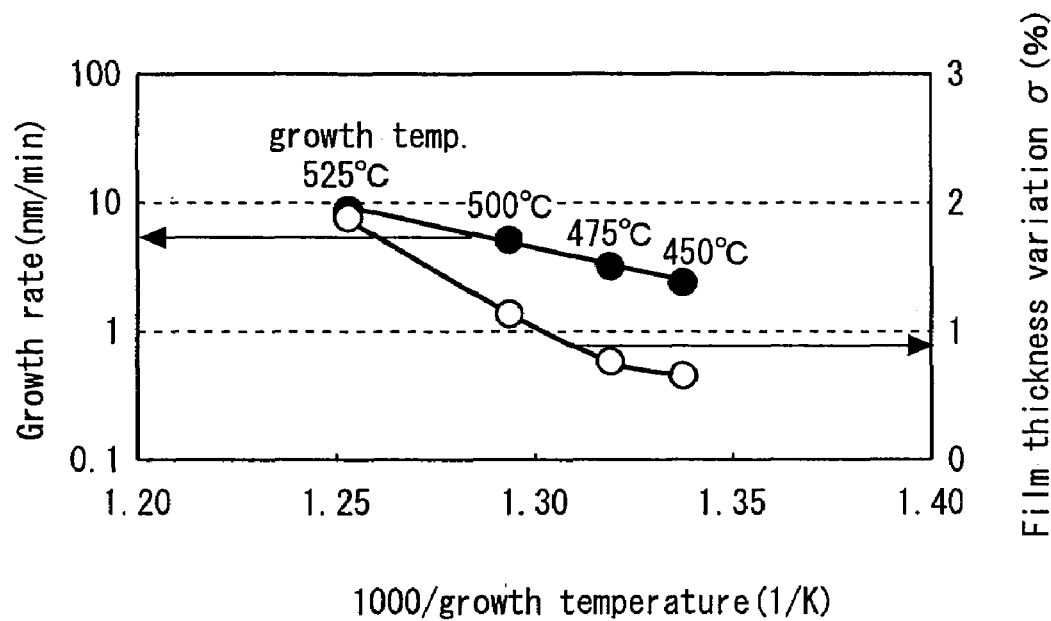
FIG. 4 is a graph showing the relationship between the growth temperature of a thin SiGe film, and the growth rate and the uniformity of the film thickness on the surface of the thin SiGe film.

FIG. 4 is a graph showing the relationship between the growth temperature of a thin SiGe film, and the growth rate and the uniformity of the film thickness on the surface of the thin SiGe film. Here, the uniformity of the film thickness on the surface means the variation σ (%) of the thickness of the thin SiGe film measured at 49 points on the surface. The thin SiGe film having a Ge content of 0.3 (30%) was grown under a flow-rate ratio of $H_2$-diluted 10% $GeH_4$ to $SiH_4$ of 0.96.

As FIG. 4 shows, although the growth rate increases with the elevation of the growth temperature, the uniformity of the film thickness on the surface of the thin SiGe film (film thickness variation σ) worsens. When the growth temperature is 525° C. or above, the value of film thickness variation σ increases to larger than 2%, and the uniformity of the film thickness on the surface worsens. If the growth temperature is even higher, the value of the surface roughness of the thin SiGe film increases, and the consequent etching process of the gate electrode will become difficult. In order to make the value of film thickness variation σ 1%, that is, in order to achieve a favorable uniformity of the film thickness on the surface, the growth temperature is preferably 494° C. or below, and more preferably 475° C. Although not shown in the graph, the growth temperature of below 450° C. is not preferable from the point of view of productivity, because the growth rate of the thin SiGe film is lowered, and therefore the throughput is lowered.

Therefore, in order to achieve a favorable uniformity of the film thickness on the surface of the thin SiGe film 10, the growth temperature of the thin SiGe film 10 is preferably 450° C. or above and 494° C. or below, and most preferably 475° C.

The quality of the thin SiGe film 10 varies depending on the growth pressure. The growth pressure of the thin SiGe film 10 is preferably below 30 Pa, or 150 Pa or above, and more preferably 10 Pa. The own investigation by the present inventor will be described below. The present inventor investigated the conformation of the thin SiGe film by varying the growth pressure of the thin SiGe film formed on a gate dielectric film composed of a $SiO_2$ film through a seed Si film.

Figure 5A:
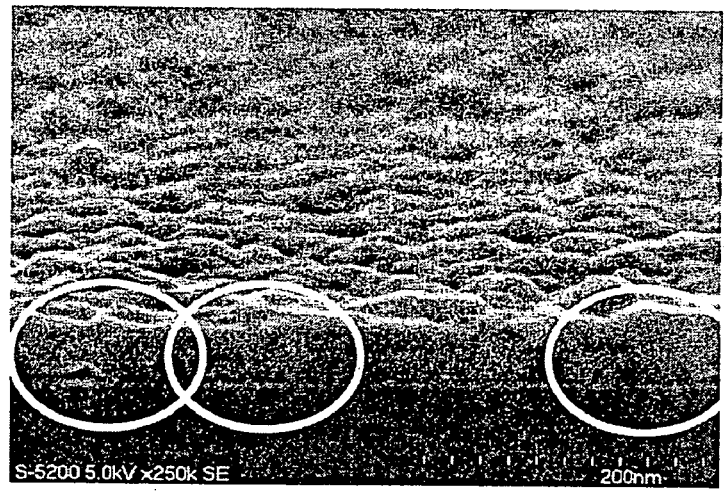
FIGS. 5A to 5C are SEM photographs showing the cross sections of a thin SiGe film when the growth pressure of the thin SiGe film was varied
Figure 5B:
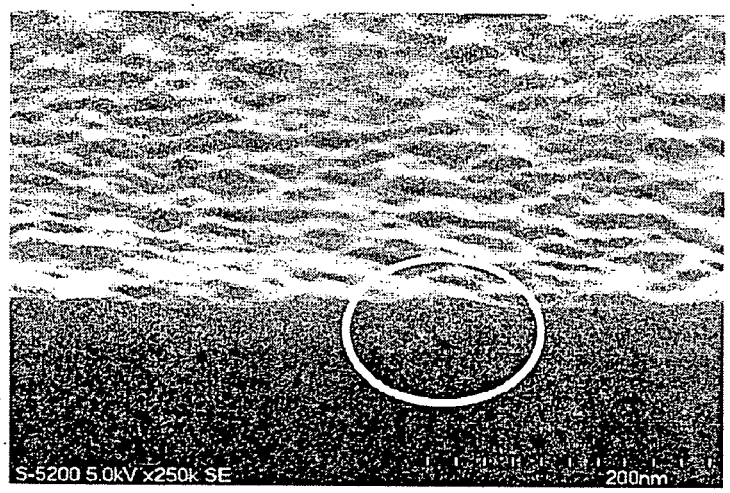
Figure 5C:
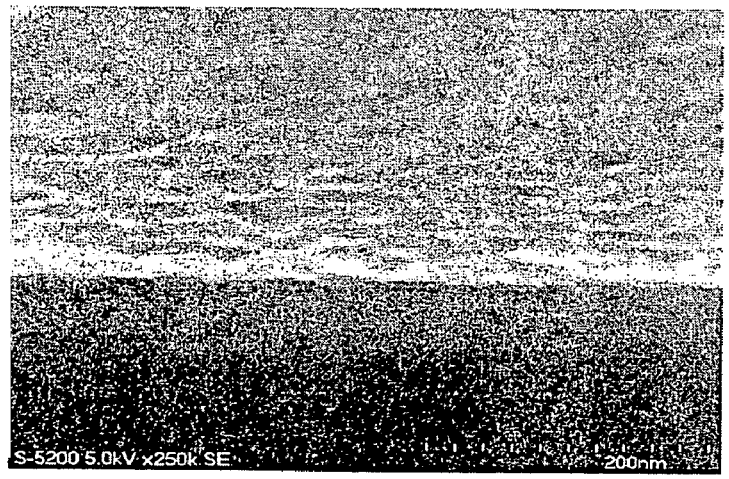

FIGS. 5A to 5C are SEM photographs showing the cross sections of a thin SiGe film when the growth pressure of the thin SiGe film was varied. Specifically, FIGS. 5A, 5B, and 5C are SEM photographs showing film morphology of thin SiGe film when the growth pressure of the thin SiGe film was 30 Pa, 20 Pa, and 200 Pa, respectively.

As FIG. 5A shows, when the thin SiGe film was formed under a pressure of 30 Pa, voids (in the circled portions) were formed in the thin SiGe film. On the other hand, as FIG. 5B shows, when the thin SiGe film was formed under a pressure of 20 Pa, the number of voids (in the circled portions) decreased significantly, and the film quality was improved. This is because the film deposition rate is low when the thin SiGe film is grown under a pressure lower than 30 Pa, impurities such as hydrogen are released during the deposition of the film, and a polycrystalline thin SiGe film having a low impurity content and a low amorphous-component content can be formed. Thereby, a void-free polycrystalline thin SiGe film of small volume change due to change in temperature that excels in thermal stability can be obtained.

As FIG. 5C shows, when the thin SiGe film was formed under a pressure of 200 Pa, no voids were formed in the thin SiGe film, and the surface roughness was significantly improved. This is because the film deposition rate is high when the thin SiGe film is grown under a pressure of 200 Pa or above, and the deposition of film is quicker than the crystalline growth of the film. The results of X-ray diffraction analysis showed that the thin SiGe film was amorphous. Thereby, a void-free amorphous thin SiGe film that excels in surface flatness can be obtained.

Therefore, in order to achieve favorable thermal stability and surface flatness, the growth pressure of the thin SiGe film 10 is preferably below 30 Pa, or 150 Pa or above, and more preferably 10 Pa.

Next, as FIG. 2B shows, a thin cap Si film 12 is formed on the thin SiGe film 10 using the above-described LPCVD apparatus. Specifically, the thin SiGe film 10 and the thin cap Si film 12 are continuously formed at the same temperature. Here, the present inventor examined the effect of forming the thin cap Si film 12 on the thin SiGe film 10.

Figure 6A:
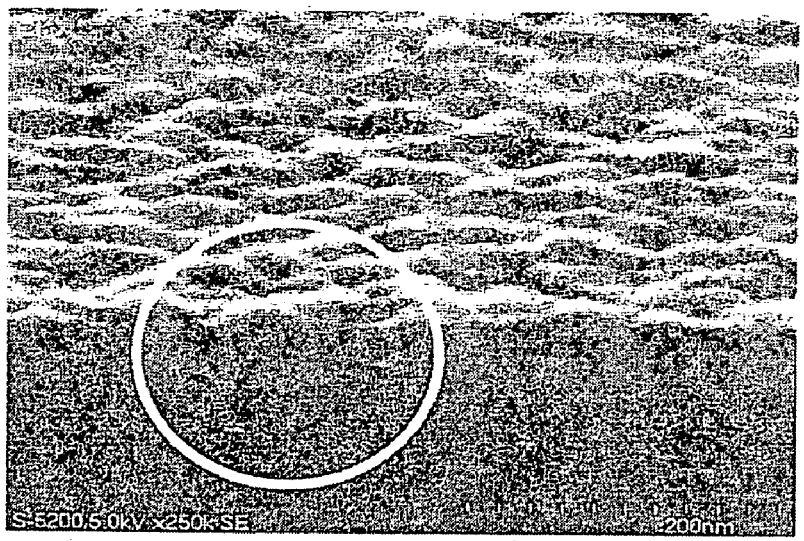
FIGS. 6A and 6B are SEM photographs showing the cross sections of a thin SiGe film as formed and after forming a thin cap Si film thereon.
Figure 6B:
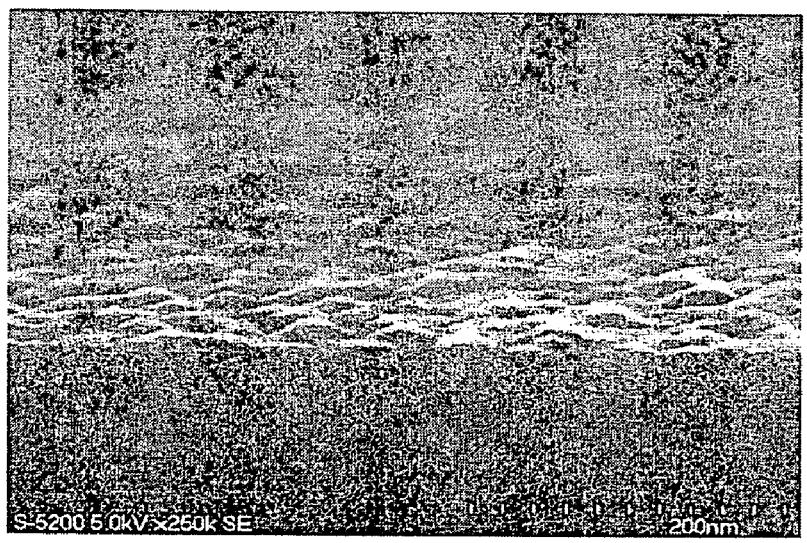

FIGS. 6A and 6B are SEM photographs showing the cross sections of a thin SiGe film as formed and after forming a thin cap Si film thereon. Here, the Ge content in the thin SiGe film is 0.3 (30%), the growth temperature is 475° C., the growth pressure is 10 Pa, and the thickness of the grown film is 50 nm. The growth temperature of the thin cap Si film is 475° C., the same as the growth temperature of the thin SiGe film, the flow rate of $SiH_4$ is 1 slm, and the thickness of the grown film is 5 nm. The present inventor confirmed the growth rate of the thin cap Si film is 0.25 nm/min at the above-described growth condition. Therefore, the cap Si film cannot be thickened, i.e. the thick cap Si film cannot be applied to the mass production, since throughput is lowered. When the growth temperature is raised for improving the throughput, there are problems that voids generate in the thin SiGe film and the surface of the SiGe film is roughened.

As FIG. 6A shows, when the thin cap Si film is not formed, that is, immediately after forming the thin SiGe film 10, there are voids in the thin SiGe film 10 (in the circled portions). As FIG. 6B shows, by forming the thin cap Si film 12, voids in the thin SiGe film 10 disappear, and a high-quality thin SiGe film can be obtained. The reason why voids disappear is that the formation of the thin cap Si film 12 lowers the surface energy compared with the case when the thin SiGe film 10 is exposed on the surface, and thermally stabilizes the thin SiGe film 10.

Therefore, by continuously growing the thin cap Si film 12 after growing the thin SiGe film 10 on the gate dielectric film 6 through the seed Si film 8, a high-quality void-free thin SiGe film can be obtained. The thermal stability of the configuration of the thin SiGe film 10 is also improved. Thus, avoid-free thin SiGe film that excels in surface flatness can be obtained.

The present inventor confirmed the problems of increase in surface roughness of the thin SiGe film and the formation of voids in the film when the thin-SiGe film 10 and the thin cap Si film 12 are not continuously formed, or not formed at the same temperature, that is, the temperature is changed. Increase in surface roughness causes increase in non-uniformity of impurity introduction in the consequent process, or increase in non-uniformity of gate processing. The formation of voids deteriorates electrical properties due to the acceleration of the reduction and decomposition of the gate dielectric film even if the voids are minute. However, as described above, the occurrence of such problems can be prevented by continuously forming the thin SiGe film 10 and the thin cap Si film 12 at the same temperature.

Figure 2C:
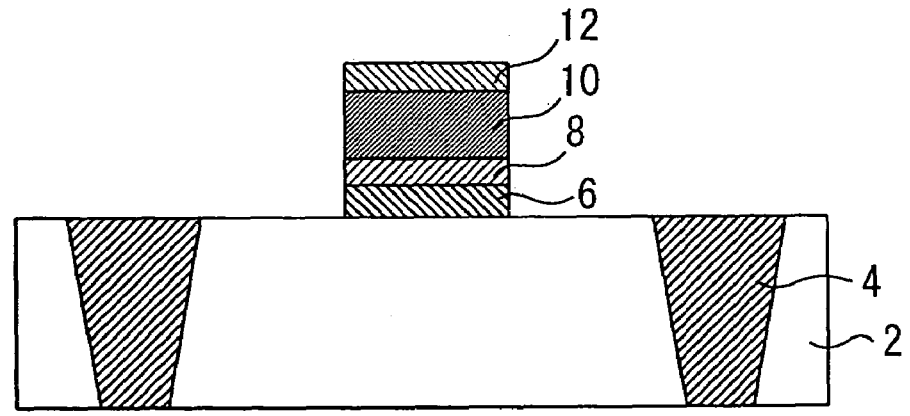

Next, as FIG. 2C shows, the thin cap Si film 12, the thin SiGe film 10, the seed Si film 8, and the gate dielectric film 6 are sequentially patterned using lithography technique and etching technique well known in the art. Thereby, the gate electrode of the MOSFET is formed.

Figure 2D:
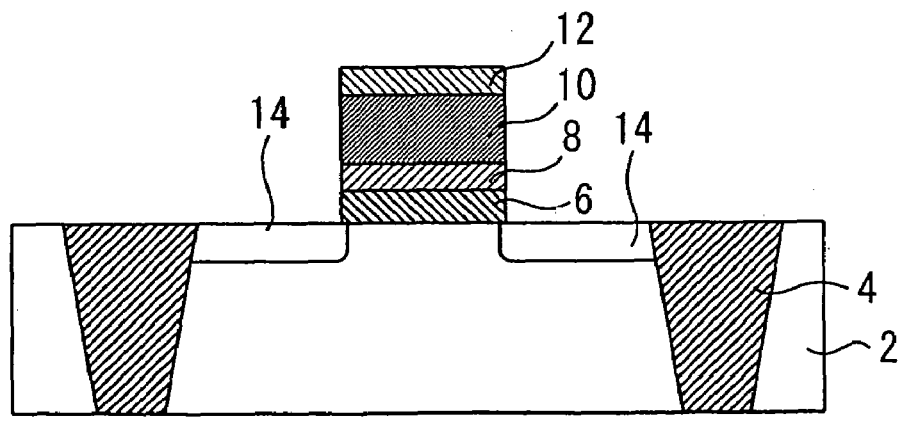

Finally, as FIG. 2D shows, conductive impurity ions are implanted using the gate electrode as the mask to form the source-drain region 14 on the upper layer of the silicon substrate 2.

In the first embodiment, as described above, the thin SiGe film 10 is formed on the gate dielectric film 6 through the seed Si film 8 at low growth temperature (450° C. or above and 494° C. or below), and a thin cap Si film 12 of a thickness of 0.5 nm to 5 nm is formed thereon at the same growth temperature. By forming the thin cap Si film 12, a void-free high-quality thin SiGe film 10 can be formed on the gate dielectric film 6. Thus, the thin SiGe film 10 that excels in the uniformity of film thickness can be formed in the boundary between the gate dielectric film 6 and the gate electrode, and a uniform Ge content in the boundary can be achieved. Therefore, the thickness of the thin SiGe film 10 can be reduced, and high-performance transistors can be manufactured in high reproducibility. Further a high quality thin SiGe film can be attained with restraint of deterioration of throughput, since the thickness of the thin cap Si film 12 is within the range of 0.5 nm to 5 nm.

In addition, as described above, since the thin SiGe film 10 is a thin film having a favorable film-thickness uniformity, local defective processing such as the dent of the silicon substrate 2 caused by voids in the thin SiGe film during dry etching for forming the gate electrode can be avoided. Thereby, the process margin in the gate processing can be enlarged, and high-performance transistors can be stably manufactured.

Second Embodiment

First, the structure of a semiconductor device according to a second embodiment of the present invention will be described.

Figure 7:
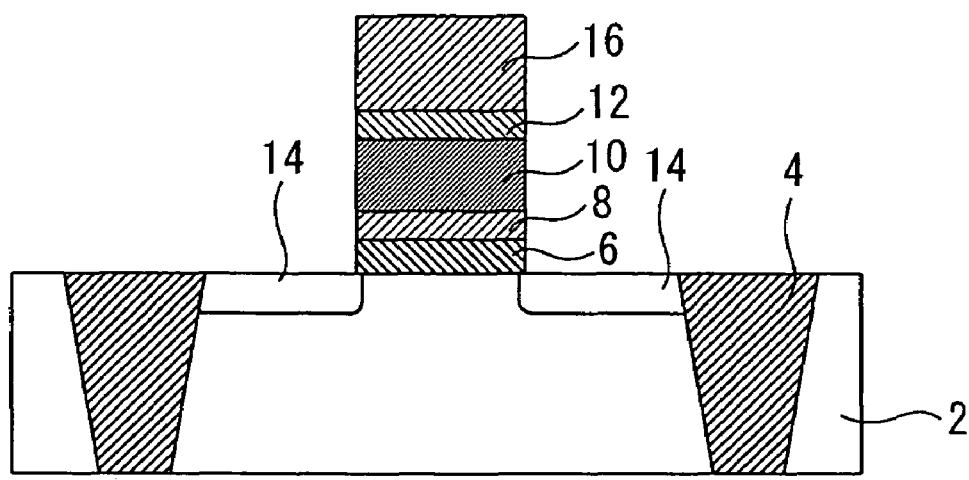
FIG. 7 is a schematic cross-sectional view for illustrating a semiconductor device according to a second embodiment of the present invention.

FIG. 7 is a schematic cross-sectional view for illustrating a semiconductor device according to a second embodiment of the present invention.

The semiconductor device according to the second embodiment shown in FIG. 7 differs from the above-described semiconductor device according to the first embodiment in that an upper Si film 16 is further formed on the thin cap Si film 12.

Specifically, as FIG. 7 shows, in the semiconductor device according to the second embodiment, a gate electrode formed on a silicon substrate 2 through a gate dielectric film 6 comprises a seed Si film 8, a thin SiGe film 10 of a thickness of 50 nm or below, a thin cap Si film 12 of a thickness of 0.5 nm to 5 nm, and an upper Si film 16 of a thickness of 60 nm to 120 nm. The total thickness of the gate electrode is preferably 80 nm to 160 nm.

Next, a method for manufacturing the semiconductor device will be described.

Figure 8:
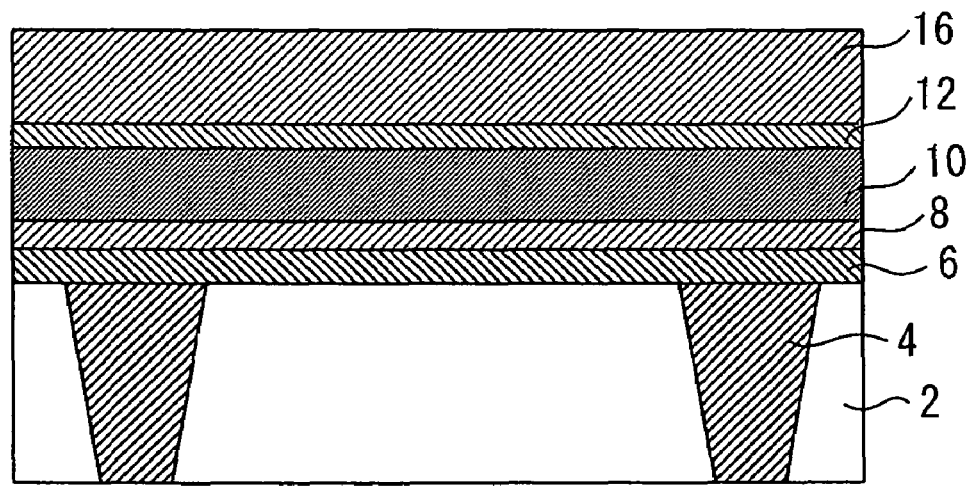
FIG. 8 is a process sectional view for illustrating a method for manufacturing the semiconductor device according to a second embodiment of the present invention.

FIG. 8 is a process sectional view for illustrating a method for manufacturing the semiconductor device according to the second embodiment.

First, in the same manner as in the manufacturing method according to the first embodiment, elements up to the thin cap Si film 12 are formed.

Next, as FIG. 8 shows, an upper Si film 16 is formed on the thin cap Si film 12 using a LPCVD method. The upper Si film 16 can be formed using the above-described batch-type vertical LPCVD apparatus, and the growth conditions of the upper Si film 16 are, for example, an $SiH_4$ flow rate of 1 slm, a growth temperature of 530° C., and a growth pressure of 100 Pa.

Here, the present inventor examined the effect obtained from the structure having the thin cap Si film 12 underneath the upper Si film 16.

Figure 9A:
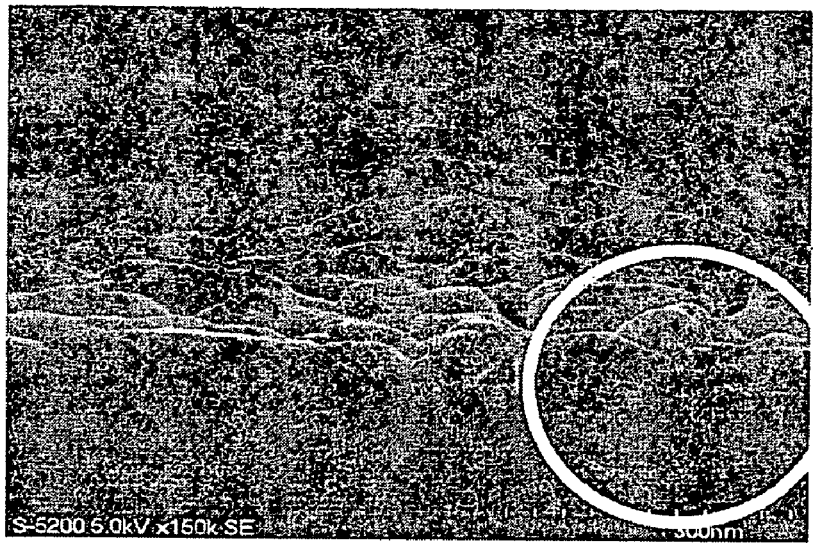
FIGS. 9A and 9B are SEM photographs showing the cross sections of the thin SiGe film after heat treatment corresponding to the growth of the upper Si film in the case when a thin cap Si film is formed and not formed on the thin SiGe film.
Figure 9B:
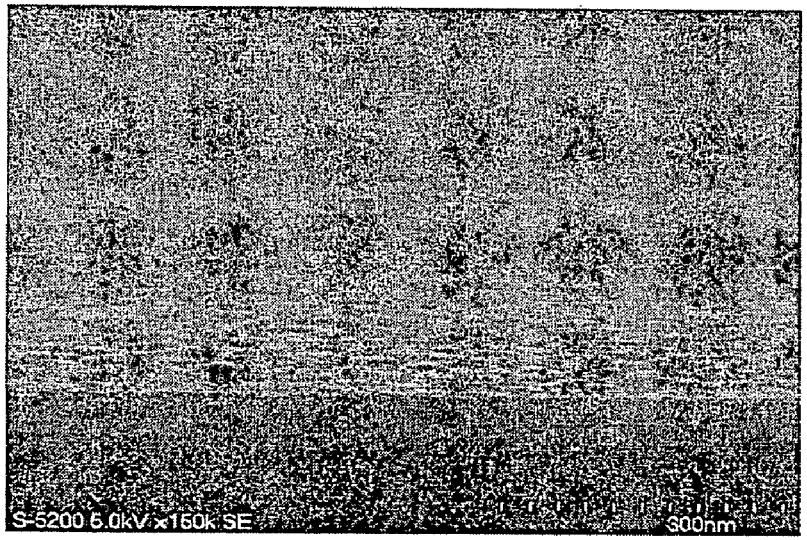

FIGS. 9A and 9B are SEM photographs showing the cross sections of the thin SiGe film after heat treatment corresponding to the growth of the upper Si film in the case when a thin cap Si film is formed and not formed on the thin SiGe film. Specifically, FIG. 9B is a photograph showing the state of the thin SiGe film after the heat treatment corresponding to the growth of the upper Si film 16 without forming a thin cap Si film after forming a thin SiGe film on the gate dielectric film through a seed Si film; and FIG. 9B is a photograph showing the state of the thin SiGe film after the heat treatment corresponding to the growth of the upper Si film 16 when a thin cap Si film is formed on the thin SiGe film after forming the thin SiGe film on the gate dielectric film through a seed Si film. The Ge content of the thin SiGe film is 0.3 (30%), the growth temperature is 475° C., the thickness of the grown film is 40 nm, and the growth pressure is 200 Pa. As the heat treatment corresponding to the growth of the upper Si film 16, heat treatment is performed at a temperature of 530° C. for about 60 minutes. This heat treatment corresponds the growth of the upper Si film with a thickness of 120 nm.

As FIG. 9A shows, when no thin cap Si film is formed, the film configuration of the thin SiGe film, which was continuous and flat before heat treatment (i.e., immediately after the growth of the thin SiGe film) is significantly changed, the surface roughness is enlarged, and a discontinuous film is formed (refer to the circled portion in FIG. 9A). In addition, voids are formed in the thin SiGe film after heat treatment. However, as FIG. 9B shows, when the thin cap Si film is formed, the thin SiGe film after heat treatment is maintained continuous, and the flatness is also maintained. Furthermore, no voids are formed in the thin SiGe film after heat treatment.

Therefore, the formation of the thin cap Si film 12 between the thin SiGe film 10 and the upper Si film 16 can restrict the formation of voids in the thin SiGe film during the formation of the upper Si film 16.

The temperature for forming the upper Si film 16 is preferably higher than the temperature for forming the underlying thin cap Si film 12 and the thin SiGe film 10, for example, 530° C. to 620° C. Since the formation of the upper Si film 16 at such a high temperature increases the growth rate and improves the throughput, the productivity of semiconductor device is improved.

Figure 10A:
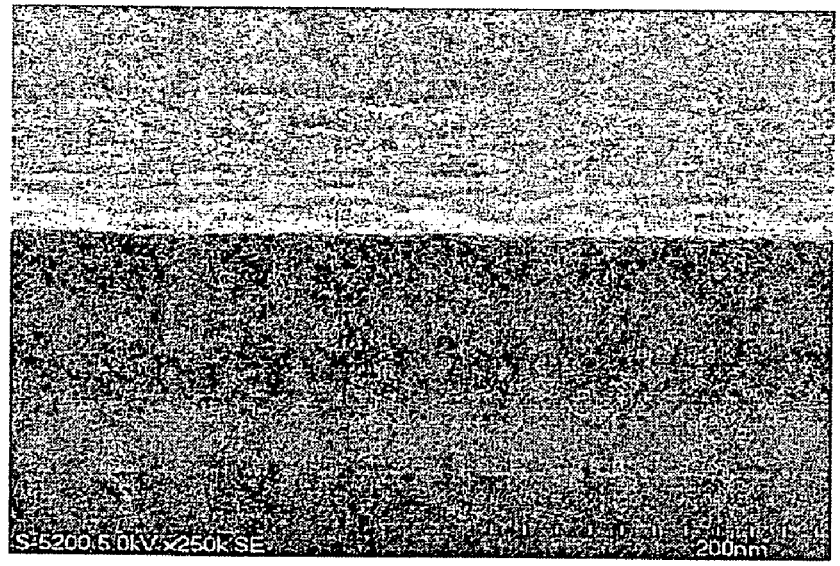
FIGS. 10A and 10B are SEM photographs showing the cross sections of a thin SiGe film when the growth temperature of the upper Si film is changed in the formation of the upper Si film on the thin SiGe film through the thin cap Si film.
Figure 10B:
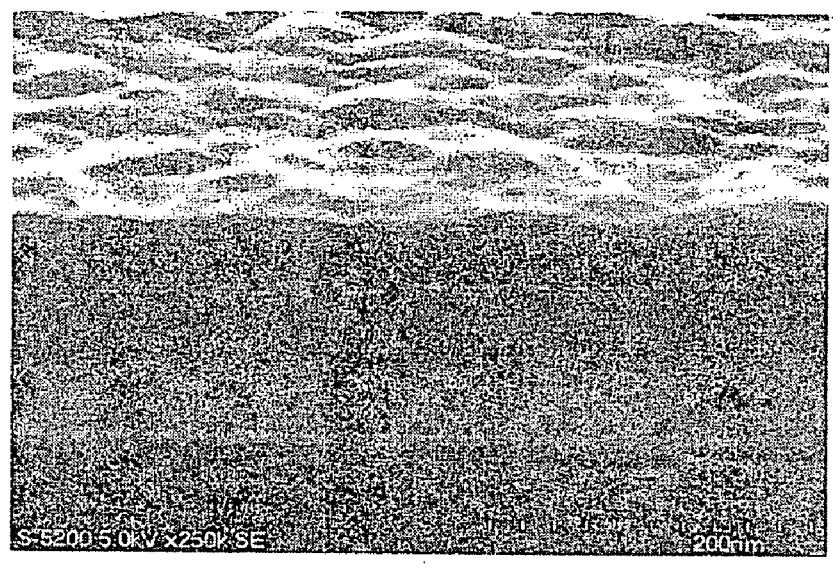

FIGS. 10A and 10B are SEM photographs showing the cross sections of a thin SiGe film when the growth temperature of the upper Si film is changed in the formation of the upper Si film on the thin SiGe film through the thin cap Si film after forming the thin SiGe film on the gate dielectric film through the seed Si film. Specifically, FIG. 10A is a photograph showing the state of the laminated film when the upper Si film is formed under the condition of an $SiH_4$ flow rate of 1 slm, a temperature of 530° C., and a pressure of 100 Pa; and FIG. 10B is a photograph showing the state of the laminated film when the upper Si film is formed under the condition of an $SiH_4$ flow rate of 0.6 slm, a temperature of 620° C., and a pressure of 20 Pa. The Ge content of the thin SiGe film is 0.3 (30%), the growth temperature is 475° C., and the thickness of the grown film is 40 nm. The growth temperature of the thin cap Si film is 475° C., the same as the growth temperature of the thin SiGe film, and the thickness of the grown film is 5 nm.

As FIGS. 10A and 10B show, when the upper Si film is formed under either condition, no voids are formed in the thin SiGe film, and a continuous thin SiGe film can be formed.

Next, in the same manner as in the first embodiment, the upper Si film 16, the thin cap Si film 12, the thin SiGe film 10, the seed Si film 8, and the gate dielectric film 6 are sequentially patterned using lithography technique and etching technique well known in the art. Thereby, the gate electrode of the MOSFET is formed. Finally, conductive impurity ions are implanted using the gate electrode as the mask to form the source-drain region 14 in the upper layer of the silicon substrate 2. Performing the above-described processes attains the semiconductor device shown in FIG. 7.

In the second embodiment, as described above, a thin SiGe film 10 is formed on a gate dielectric film 6 through a seed Si film 8 at low growth temperature, and a thin cap Si film 12 of a thickness of 0.5 nm to 5 nm is continuously formed thereon at the same growth temperature. By forming the thin cap Si film 12, as in the above-described first embodiment, a void-free high-quality thin SiGe film 10 can be formed on the gate dielectric film 6. Thus, the uniform thin SiGe film 10 can be formed in the boundary between the gate dielectric film 6 and the gate electrode, and a uniform Ge content in the boundary can be achieved. Therefore, the thickness, of the thin SiGe film 10 can be reduced, and high-performance transistors can be manufactured in high reproducibility.

In addition, as described above, since the thin SiGe film 10 is a thin film having a favorable film-thickness uniformity, local defective processing such as the dent of the silicon substrate 2 caused by voids in the thin SiGe film 10 during dry etching for forming the gate electrode can be avoided. Thereby, the process margin in the gate processing can be enlarged, and high-performance transistors can be stably manufactured.

Furthermore, in the second embodiment, an upper Si film 16 is formed on the thin cap Si film 12 at a temperature higher than the growth temperature of the thin SiGe film 10. Therefore, the throughput is increased, and the productivity is improved, since the upper Si film 16 is formed at high deposition rate with maintaining quality of the thin SiGe film 10.

Third Embodiment

Figure 11:
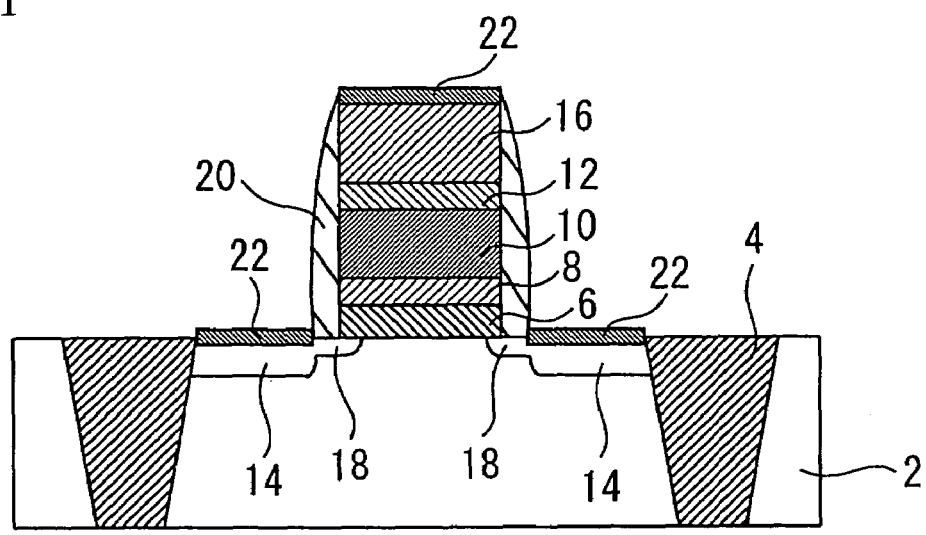
FIG. 11 is a schematic cross-sectional view for illustrating a semiconductor device according to a third embodiment of the present invention.

FIG. 11 is a schematic cross-sectional view for illustrating a semiconductor device according to a third embodiment of the present invention.

The semiconductor device according to the third embodiment shown in FIG. 11 differs from the above-described semiconductor device according to the second embodiment in that sides of the gate electrode are covered by sidewalls 20, and that silicide layers 22 are formed in upper portions of the upper Si film 16 and source-drain regions 14. Further, extension regions 18 having an impurity concentration lower than the source-drain regions 14 in the substrate 2 below the sidewalls 20.

That is to say, the semiconductor device has the silicide layers 22 formed using a well-known salicide technique in uppermost layer of the gate electrode and the source-drain regions 14. The thickness of Nibs layers serving as the silicide layers 22 is, for example, about 10 nm.

Next, a method for manufacturing the semiconductor device will be described.

Figure 12A:
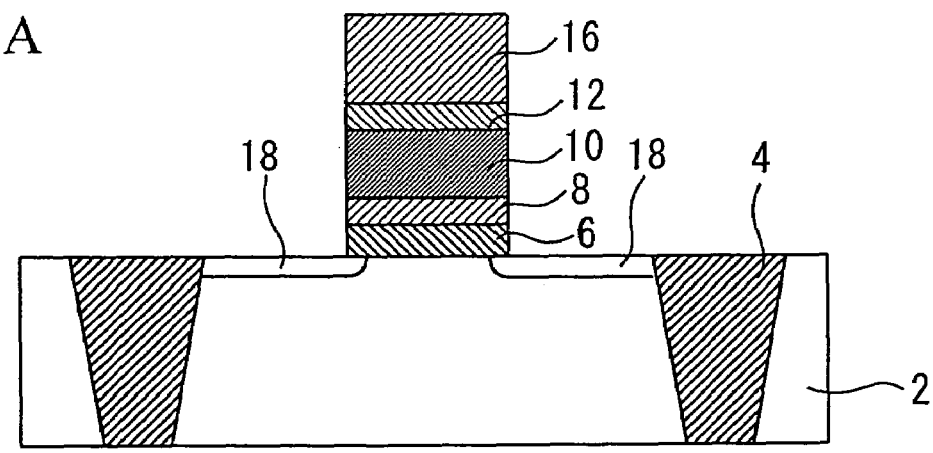
FIGS. 12A and 12B are process sectional views for illustrating a method for manufacturing the semiconductor device according to a third embodiment of the present invention.
Figure 12B:
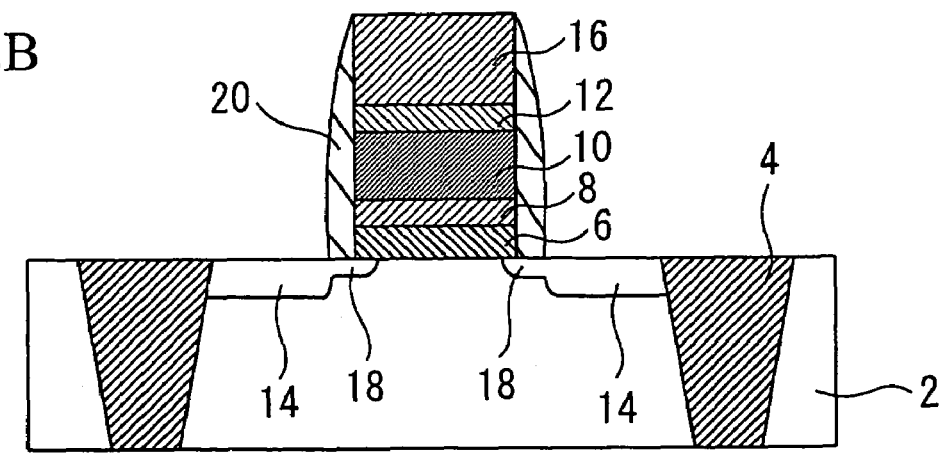

FIGS. 12A and 12B are process sectional views for illustrating a method for manufacturing the semiconductor device according to a third embodiment of the present invention.

First, in the same manner as in the manufacturing method according to the second embodiment, the upper Si film 16, the thin cap Si film 12, the thin SiGe film 10, the seed Si film 8, and the gate dielectric film 6 are sequentially patterned using lithography technique and etching technique well known in the art. Next, as FIG. 12A shows, extension regions 18 are formed in the upper portion of the substrate 2 by ion implantation of impurities with a low concentration using the gate electrode as a mask.

Next, an insulating film such as $SiO_2$ or $Si_3N_4$ is formed over the entire of the substrate 2, and the insulating film is etched using an anisotropic dry etching method. Thus, as FIG. 12B shows, sidewalls 20 are formed on the sides of the gate electrode. Source-drain regions 14 are formed in the upper portion of the substrates 2 by ion implantation of impurities with a high concentration using the gate electrode and sidewalls 20 as a mask.

Next, stacked layers composed of Ni film/TiN film are formed with thickness of 11 nm/10 nm over the entire of the substrate, and a heat treatment is performed. Thus, Ni film is reacted with the upper Si film 16 and the source-drain regions 14, and NiSi layers 22 are formed. Here, quality of the thin SiGe film is maintained during the heat treatment by the presence of the cap Si film 12. The semiconductor device shown in FIG. 11 is attained by getting rid of the Ni film/TiN film which has not reacted using chemical solution.

In the third embodiment, as described above, the NiSi layers 22 are formed in upper portions of the upper Si film 16 and source-drain regions 14 using salicide technique. The quality of the thin SiGe film 10 can be maintained even if the heat treatment for forming the NiSi layers 22 is done in addition to the effects attained in the second embodiment.

Fourth Embodiment

Figure 13:
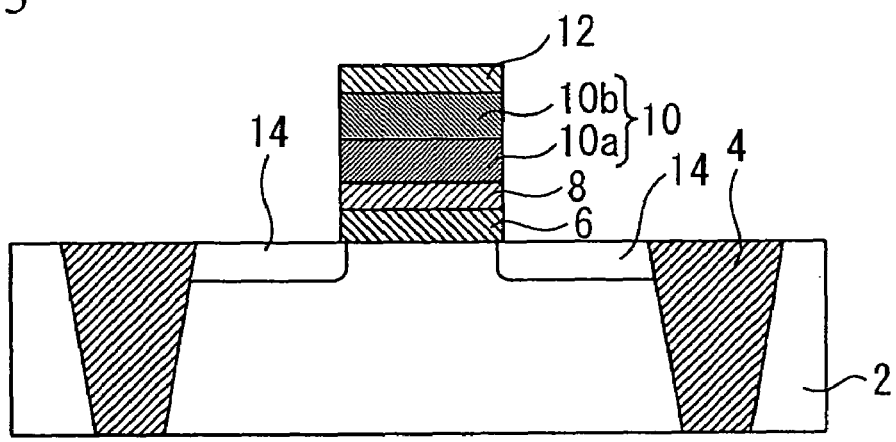
FIG. 13 is a schematic cross-sectional view for illustrating a semiconductor device according to a fourth embodiment of the present invention.

FIG. 13 is a schematic cross-sectional view for illustrating a semiconductor device according to a fourth embodiment of the present invention.

The semiconductor device according to the fourth embodiment shown in FIG. 13 differs from the above-described semiconductor device according to the first embodiment in that thin SiGe film 10 made by stacking a plurality of SiGe layers 10a and 10b. This difference will be described as follows.

In the fourth embodiment, on the seed Si film 8 is formed the thin SiGe film 10 by stacking a first SiGe layer 10a and a second SiGe layer 10b. The first and second SiGe layers 10a and 10b differ in Ge content X of formula $Si_{(1-x)}Ge_x$ representing the first and second SiGe layers 10a and 10b respectively. The first and second SiGe layers 10a and 10b are continuously formed at the same growth temperature. Here, each Ge content X of the SiGe layers 10a and 10b is 0.15 or more and smaller than 0.4. The film thickness of the first SiGe layer 10a may differ from the film thickness if the second SiGe layer 10b. Total thickness of the SiGe layers 10a and 10b is preferably 50 nm or below.

On the second SiGe layer 10b is formed the thin cap Si film 12 of the thickness of 0.5 nm to 5 nm. The first and second SiGe layer 10a and 10b and the thin cap Si film 12 are continuously formed at the same temperature.

Next, a method for manufacturing the semiconductor device will be described.

Figure 14A:
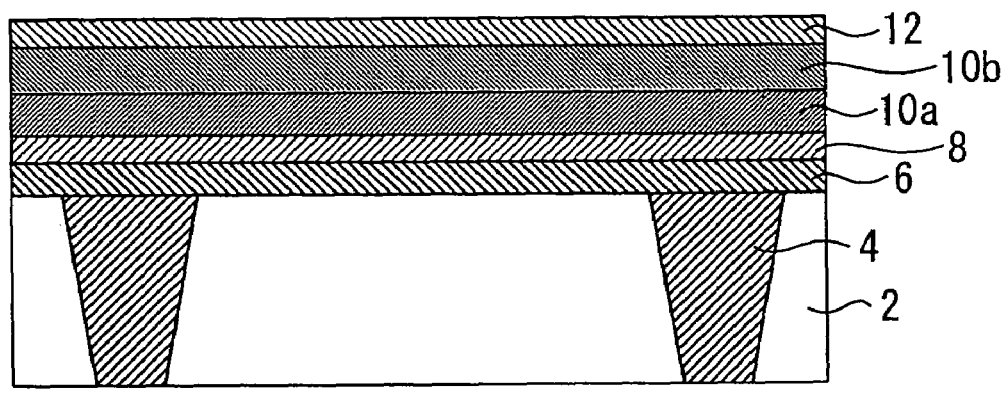
FIGS. 14A and 14B are process sectional views for illustrating a method for manufacturing the semiconductor device according to a fourth embodiment of the present invention.
Figure 14B:
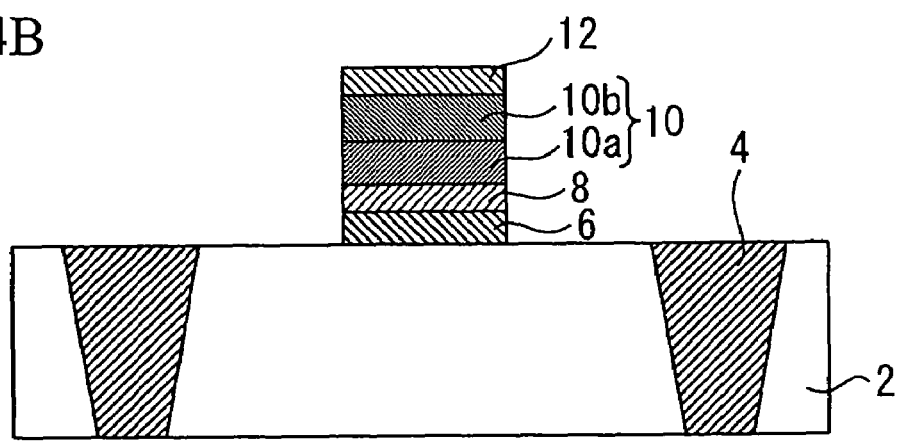

FIGS. 14A and 14B are process sectional views for illustrating a method for manufacturing the semiconductor device according to the fourth embodiment.

First, in the same manner as in the manufacturing method according to the first embodiment, the gate dielectric film 6 is formed on the substrate 2, and the seed Si film 8 is formed on the gate dielectric film 6.

Next, the first SiGe layer 10a is formed on the seed Si film 8, the second SiGe layer 10b is formed on the first SiGe layer 10a, and the thin cap Si film 12 is formed on the second SiGe layer 10b. Thereby, the structure shown in FIG. 14A is attained. Here, the first SiGe layer 10a, the second SiGe layer 10b and the thin cap Si film 12 are continuously formed at the same temperature. The forming temperature is preferably 450° C. or above and 494° C. or below, and most preferably 475° C. The first and second SiGe layers having different Ge content are formed by changing the flow-rate ratio of $H_2$-diluted 10% $GeH_4$ to $SiH_4$.

Next, as FIG. 14B shows, the thin cap Si film 12, the second SiGe layer 10b, the first SiGe layer 10a, the seed Si film 8, and the gate dielectric film 6 are sequentially patterned using lithography technique and etching technique well known in the art. Thereby, the gate electrode of the MOSFET is formed.

Finally, conductive impurity ions are implanted using the gate electrode as the mask to form the source-drain region 14 in the upper layer of the silicon substrate 2. Performing the above-described processes attains the semiconductor device shown in FIG. 13.

Therefore, according to the fourth embodiment, the equivalent effects as the effects obtained in the first embodiment can be obtained.

In the fourth embodiment, although the thin SiGe film 10 is formed by two SiGe layers 10*a* and 10*b*, the thin SiGe film 10 may be formed by stacking three or more SiGe layers.

Although the thin SiGe film 10 is formed by the SiGe layers having different Ge content, the thin SiGe film 10 may be formed by stacking an amorphous SiGe layer and a polycrystalline SiGe layer. In this case, the amorphous SiGe layer can be grown under a growth pressure 150 Pa, and the polycrystalline SiGe layer can be grown under a growth pressure of 30 Pa.

Further, an upper Si may be formed on thin cap Si film 12 using the same manner as in the manufacturing method according to the second embodiment (The same applies to second to fifth embodiments described later.).

Fifth Embodiment

Figure 15:
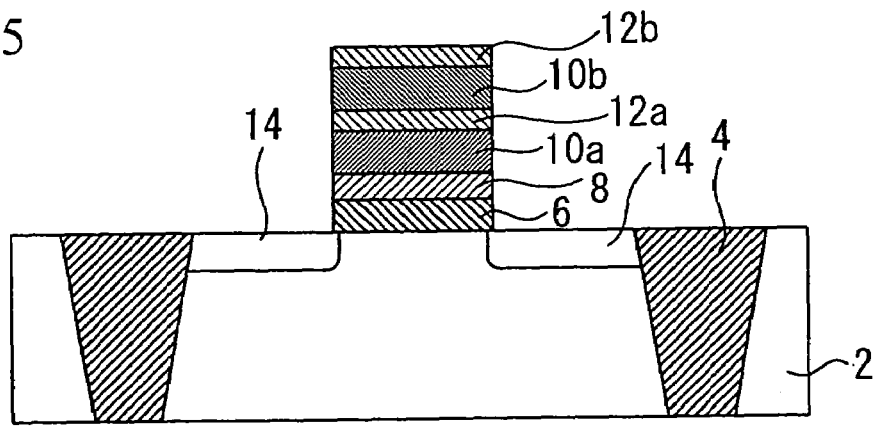
FIG. 15 is a schematic cross-sectional view for illustrating a semiconductor device according to a fifth embodiment of the present invention.

FIG. 15 is a schematic cross-sectional view for illustrating a semiconductor device according to a fifth embodiment of the present invention.

In the semiconductor device shown in FIG. 15, the gate electrode comprises a plurality of SiGe layers 10*a* and 10*b* and a plurality of thin cap Si films 12*a* and 12*b*. The SiGe layers and the thin cap films are stacked alternately. The difference between the fifth embodiment and the first embodiment will be described as follows.

In the fifth embodiment, on the seed Si film 8 is formed a first SiGe layer 10*a*, and a first thin cap Si film 12*a* is formed on the first SiGe layer 10*a*. On the first thin cap Si film 12*a* is formed a second SiGe layer 10*b*, and a second thin cap Si film 12*b* is formed on the second SiGe layer 10*b*. Here, each Ge content X of the SiGe layers 10*a* and 10*b* is 0.15 or more and smaller than 0.4. The film thickness of the first SiGe layer 10*a* may differ from the film thickness if the second SiGe layer 10*b*. Total thickness of the SiGe layers 10*a* and 10*b* is preferably 50 nm or below. The each film thickness of the first and second thin cap Si films 12*a* and 12*b* is preferably 0.5 nm to 5 nm.

Next, a method for manufacturing the semiconductor device will be described.

Figure 16A:
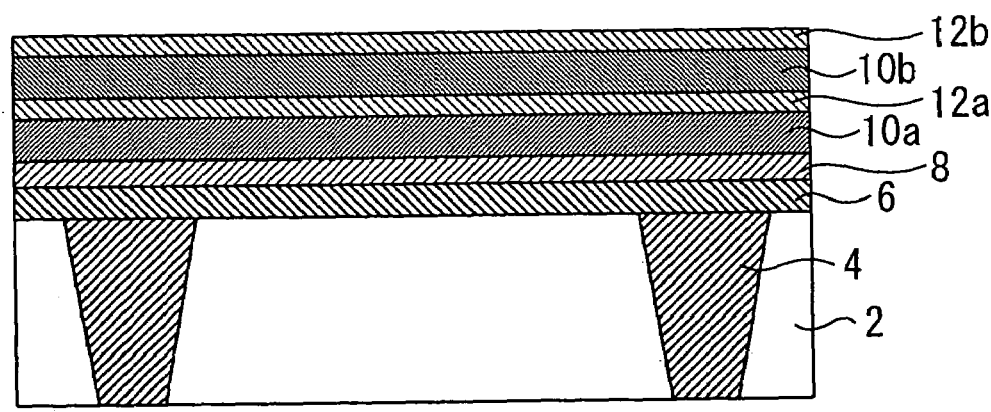
FIGS. 16A and 16B are process sectional views for illustrating a method for manufacturing the semiconductor device according to a fifth embodiment of the present invention.
Figure 16B:
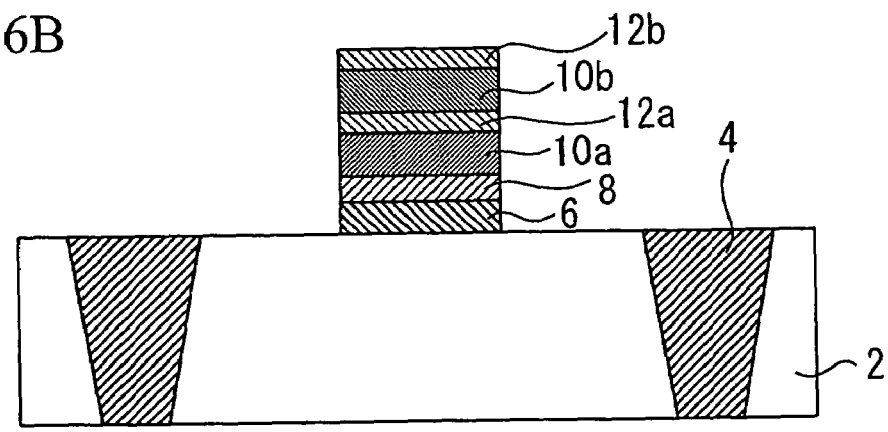

FIGS. 16A and 16B are process sectional views for illustrating a method for manufacturing the semiconductor device according to the fifth embodiment.

First, in the same manner as in the manufacturing method according to the first embodiment, the gate dielectric film 6 is formed on the substrate 2, and the seed Si film 8 is formed on the gate dielectric film 6.

Next, the first SiGe layer 10*a* is formed on the seed Si film 8, and the first thin cap Si film 12*a* is formed on the first SiGe layer. 10*a*. The second SiGe layer 10*b* is formed on the first thin cap Si film 12*a*, and the second thin cap Si film 12*b* is formed on the second SiGe layer 10*b*. Thereby, the structure shown in FIG. 16A is attained. Here, the first SiGe layer 10*a*, the first thin cap Si film 12*a*, the second SiGe layer 10*b* and the second thin cap Si film 12*b* are continuously formed at the same temperature. The forming temperature is preferably 450° C. or above and 494° C. or below, and most preferably 475° C.

Next, as FIG. 16B shows, the second thin cap Si film 12*b*, the second SiGe layer 10*b*, the first thin cap Si film 12*a*, the first SiGe layer 10*a*, the seed Si film 8, and the gate dielectric film 6 are sequentially patterned using lithography technique and etching technique well known in the art. Thereby, the gate electrode of the MOSFET is formed.

Finally, conductive impurity ions are implanted using the gate electrode as the mask to form the source-drain region 14 in the upper layer of the silicon substrate 2. Performing the above-described processes attains the semiconductor device shown in FIG. 15.

Therefore, according to the fifth embodiment, the equivalent effects as the effects obtained in the first embodiment can be obtained.

In the fourth embodiment, the first and second SiGe layers 10*a* and 10*b* may be formed under the same growth condition, and may be formed under the different growth conditions as described in the fourth embodiment.

Sixth Embodiment

A sixth embodiment is attained by applying the fourth embodiment to the third embodiment.

Figure 17:
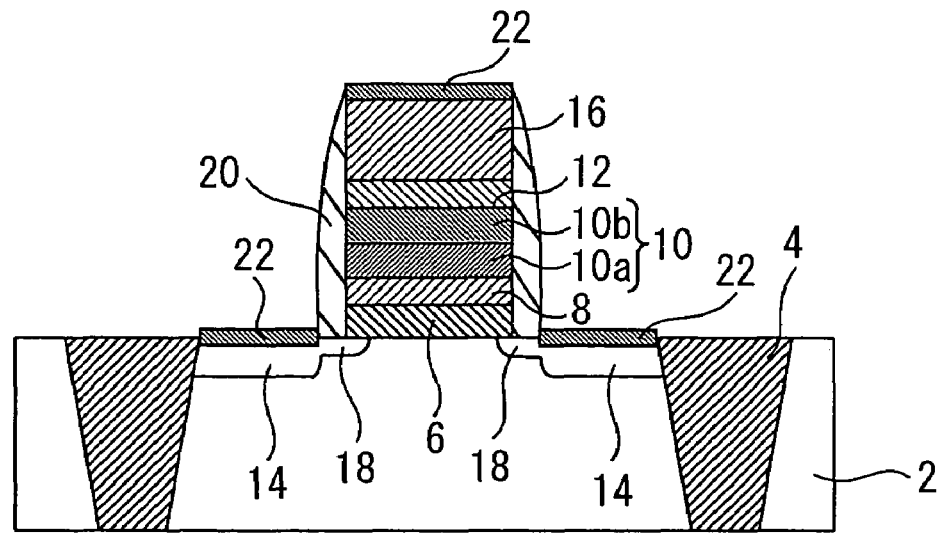
FIG. 17 is a schematic cross-sectional view for illustrating a semiconductor device according to a sixth embodiment of the present invention.

FIG. 17 is a schematic cross-sectional view for illustrating a semiconductor device according to a sixth embodiment of the present invention.

In the sixth embodiment, on the seed Si film 8 is formed the thin SiGe film 10 by stacking a first SiGe layer 10*a* and a second SiGe layer 10*b*. The first and second SiGe layers 10*a* and 10*b* differ in Ge content X of formula $Si_{(1-x)}Ge_x$ representing the first and second SiGe layers 10*a* and 10*b* respectively. The first and second SiGe layers 10*a* and 10*b* are continuously formed at the same growth temperature. Here, each Ge content X of the SiGe layers 10*a* and 10*b* is 0.15 or more and smaller than 0.4. The film thickness of the first SiGe layer 10*a* may differ from the film thickness if the second SiGe layer 10*b*. Total thickness of the SiGe layers 10*a* and 10*b* is preferably 50 nm or below.

On the second SiGe layer 10*b* is formed the thin cap Si film 12 of the thickness of 0.5 nm to 5 nm. The first and second SiGe layer 10*a* and 10*b* and the thin cap Si film 12 are continuously formed at the same temperature. The upper Si film 16 of the thickness of 60 nm to 120 nm is formed on the thin cap Si film 12.

Sides of the gate electrode a recovered by sidewalls 20. Extension regions 18 having an impurity concentration lower than the source-drain regions 14 in the substrate 2 below the sidewalls 20. NiSi layers 22 are formed as silicide layers in upper portions of the upper Si film 16 and source-drain regions 14.

Next, a method for manufacturing the semiconductor device will be described.

First, in the same manner as in the manufacturing method according to the first embodiment, the gate dielectric film 6 is formed on the substrate 2, and the seed Si film 8 is formed on the gate dielectric film 6.

Next, in the same manner as in the manufacturing method according to the fourth embodiment, the first SiGe layer 10*a*, the second SiGe layer 10*b* and the thin cap Si film 12 are continuously formed on the seed Si film 8 at the same temperature.

Next, in the same manner as in the manufacturing method according to the second embodiment, the upper Si film 16 is formed on the thin cap Si film 12 at a temperature higher than the growth temperature of the first SiGe layer 10*a*.

The upper Si film 16, thin cap Si film 12, the second SiGe layer 10*b*, the first SiGe layer 10*a*, the seed Si film 8, and the gate dielectric film 6 are sequentially patterned using lithography technique and etching technique well known in the art. Thereby, the gate electrode of the MOSFET is formed. Extension regions 18 are formed in the upper portion of the substrate 2 by ion implantation of impurities with a low concentration using the gate electrode as a mask sidewalls 20 are formed on the sides of the gate electrode. Source-drain regions 14 are formed in the upper portion of the substrate 2 by ion implantation of impurities with a high concentration using the gate electrode and sidewalls 20 as a mask. Further, NiSi layers 22 are formed in upper portions of the upper Si film 16 and source-drain regions 14 using salicide technique. Performing the above-described processes attains the semiconductor device shown in FIG. 17.

Therefore, according to the sixth embodiment, the equivalent effects as the effects obtained in the first, second and third embodiments can be obtained.

Seventh Embodiment

A seventh embodiment is attained by applying the fifth embodiment to the third embodiment.

Figure 18:
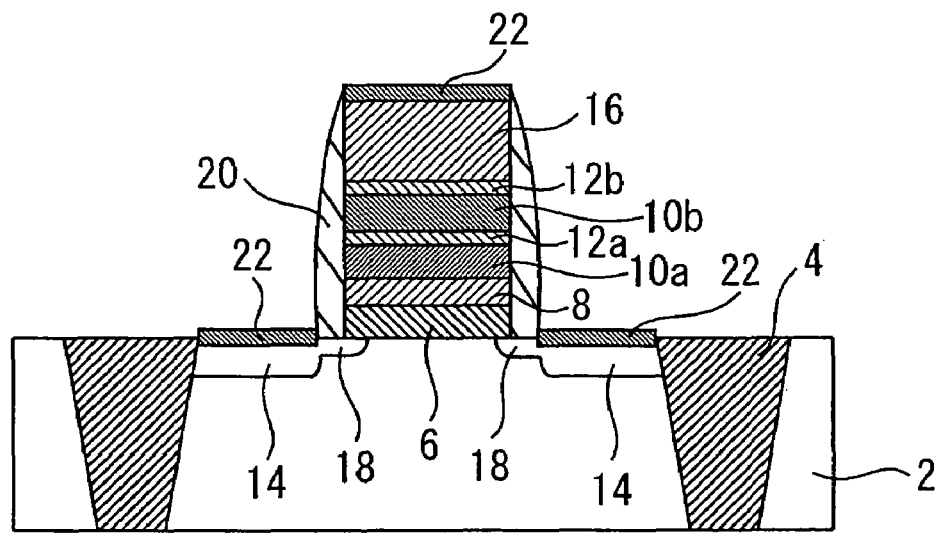
FIG. 18 is a schematic cross-sectional view for illustrating a semiconductor device according to a seventh embodiment of the present invention.
Figure 19A:
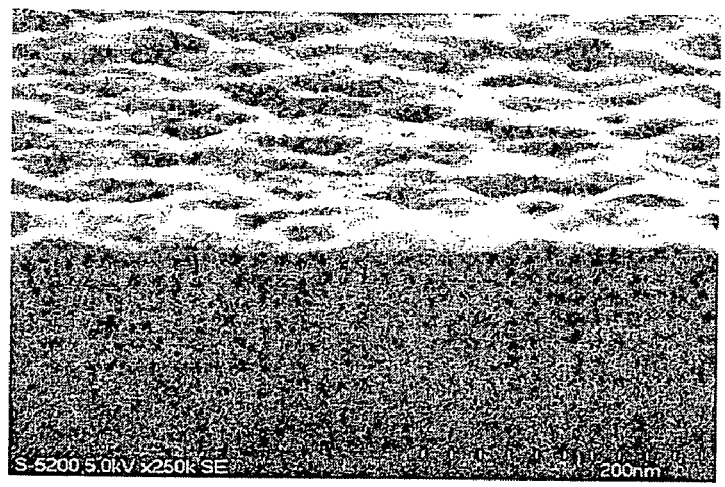
FIGS. 19A to 19C are SEM photographs showing the cross section of the thinned SiGe film grown on a gate dielectric film composed of a $SiO_2$ film.
Figure 19B:
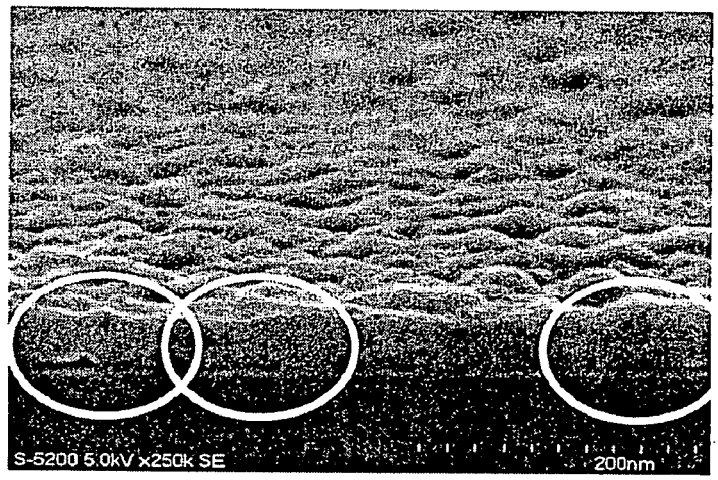
Figure 19C:

FIG. 18 is a schematic cross-sectional view for illustrating a semiconductor device according to a seventh embodiment of the present invention.

In the seventh embodiment, on the seed Si film 8 is formed a first SiGe layer 10a, and a first thin cap Si film 12a is formed on the first SiGe layer 10a. On the first thin cap Si film 12a is formed a second SiGe layer 10b, and a second thin cap Si film 12b is formed on the second SiGe layer 10b. Here, each Ge content X of the SiGe layers 10a and 10b is 0.15 or more and smaller than 0.4. The film thickness of the first SiGe layer 10a may differ from the film thickness if the second SiGe layer 10b. Total thickness of the SiGe layers 10a and 10b is preferably 50 nm or below. The each film thickness of the first and second thin cap Si films 12a. and 12b is preferably 0.5 nm to 5 nm.

The upper Si film 16 of the thickness of 60 nm to 120 nm is formed on the thin cap Si film 12.

Sides of the gate electrode are covered by sidewalls 20. Extension regions 18 having an impurity concentration lower than the source-drain regions 14 in the substrate 2 below the sidewalls 20. NiSi layers 22 are formed as silicide layers in upper portions of the upper Si film 16 and source-drain regions 14.

Next, a method for manufacturing the semiconductor device will be described.

First, in the same manner as in the manufacturing method according to the first embodiment, the gate dielectric film 6 is formed on the substrate 2, and the seed Si film 8 is formed on the gate dielectric film 6.

Next, in the same manner as in the manufacturing method according to the fifth embodiment, the first SiGe layer 10a, the first thin cap. Si film 12a, the second SiGe layer 10b and the second thin cap Si film 12b are continuously formed on the seed Si film 8 at the same temperature.

Next, in the same manner as in the manufacturing method according to the second embodiment, the upper Si film 16 is formed on the second thin cap Si film 12b at a temperature higher than the growth temperature of the first SiGe layer 10a.

The upper Si film 16, the second thin cap Si film 12b, the second SiGe layer 10b, the first thin cap Si film 12a, the first SiGe layer 10a, the seed Si film 8, and the gate dielectric film 6 are sequentially patterned using lithography technique and etching technique well known in the art. Thereby, the gate electrode of the MOSFET is formed. Extension regions 18 are formed in the upper portion of the substrate 2 by ion implantation of impurities with a low concentration using the gate electrode as a mask sidewalls 20 are formed on the sides of the gate electrode. Source-drain regions 14 are formed in the upper portion of the substrate 2 by ion implantation of impurities with a high concentration using the gate electrode and sidewalls 20 as a mask. Further, NiSi layers 22 are formed in upper portions of the upper Si film 16 and source-drain regions.14 using salicide technique. Performing the above-described processes attains the semiconductor device shown in FIG. 18.

Therefore, according to the seventh embodiment, the equivalent effects as the effects obtained in the first, second and third embodiments can be obtained.

This invention, when practiced illustratively in the manner described above, provides the following major effects:

According to the present invention, a high-quality thin SiGe film free of voids can be formed on a gate-dielectric film.

Further, the present invention is not limited to these embodiments, but variations and modifications may be made without departing from the scope of the present invention.

The entire disclosure of Japanese Patent Application No. 2003-129986 filed on May 8, 2003 containing specification, claims, drawings and summary are incorporated herein by reference in its entirety.

What is claimed is:

1. A method for manufacturing a semiconductor device comprising:
   forming a gate dielectric film on a substrate;
   forming a seed Si film on the gate dielectric film;
   forming a SiGe film on the seed Si film at a temperature between 450° C. and 494° C., and continuously forming a cap Si film with a thickness of 0.5 nm to 5 nm on the SiGe film at the same temperature at which the SiGe film is formed;
   forming an upper Si film on the cap Si film at a temperature higher than the temperature of forming the SiGe film;
   patterning the upper Si film, the cap Si film, the SiGe film, and the seed Si film to form a gate electrode; and
   forming source-drain regions in the substrate by ion implantation using the gate electrode as a mask.

2. The method for manufacturing a semiconductor device according to claim 1, including forming the upper Si film at a temperature between 530° C. and 620° C.

3. The method for manufacturing a semiconductor device according to claim 1, wherein surface energy of the thin SiGe film is lowered by forming the thin cap Si film.

4. The method for manufacturing a semiconductor device according to claim 1, including forming the SiGe film at a pressure lower than 30 Pa, or 150 Pa or higher.

5. The method for manufacturing a semiconductor device according to claim 1, wherein forming the SiGe film comprises:
   forming a first SiGe layer on the seed Si film; and
   forming a second SiGe layer on the first SiGe layer, the second SiGe layer being different in composition from the first SiGe layer.

6. The method for manufacturing a semiconductor device according to claim 5, wherein the proportion of Ge content of each of the first and second SiGe layers is different.

* * * * *